(12) United States Patent
Anderskouv et al.

(10) Patent No.: US 6,373,336 B1
(45) Date of Patent: Apr. 16, 2002

(54) METHOD OF ATTENUATING ZERO CROSSING DISTORTION AND NOISE IN AN AMPLIFIER, AN AMPLIFIER AND USES OF THE METHOD AND THE AMPLIFIER

(75) Inventors: Niels Anderskouv, Dallas, TX (US); Lars Risbo, Copenhagen (DK)

(73) Assignee: Texas Instruments, Copenhagen ApS, Copenhagen (DK)

( * ) Notice: Subject to any disclaimer, the term of this patent is extended or adjusted under 35 U.S.C. 154(b) by 0 days.

(21) Appl. No.: 09/744,575

(22) PCT Filed: Jul. 23, 1999

(86) PCT No.: PCT/DK99/00418

§ 371 Date: Apr. 27, 2001

§ 102(e) Date: Apr. 27, 2001

(87) PCT Pub. No.: WO00/07291

PCT Pub. Date: Feb. 10, 2000

(30) Foreign Application Priority Data

Jul. 24, 1998 (DK) .................................. PA 1998 00974

(51) Int. Cl.[7] .................................................. H03F 3/38
(52) U.S. Cl. ...................................... 330/10; 330/207 A
(58) Field of Search ............................... 330/10, 207 A, 330/251

(56) References Cited

U.S. PATENT DOCUMENTS 4,326,170 A * 4/1982 Levy ........................... 330/10
4,968,948 A * 11/1990 Tokumo et al. ............... 330/10
5,767,740 A * 6/1998 Fogg ............................ 330/10
5,963,086 A * 10/1999 Hall ............................. 330/10
6,028,944 A * 2/2000 Markow et al. ............. 381/120
6,262,632 B1 * 7/2001 Corsi et al. ................. 330/251

* cited by examiner

Primary Examiner—Robert Pascal
Assistant Examiner—Henry Choe
(74) Attorney, Agent, or Firm—Willam B. Kempler; Frederick J. Telecky, Jr.

(57) ABSTRACT

According to the invention, a method and an amplifier e.g. of the class D type, in particular connected as class BD, wherein an audio signal is pulse-with modulated in that two sets of switches are adapted to make and break signal paths transferring pulses representing the non-inverted or inverted part of the audio signal, comprise attenuating noise and zero crossing distortion which occur because of crosstalk between modulator and control circuit halves in the amplifier. Noise and zero crossing distortion are attenuated by delaying the pulses which represent the non-inverted part and the inverted part, respectively, of the audio signal relative to each other, when the audio signal is in the vicinity of the value 0, thereby achieving modulation of the audio signal which contains characteristics from pulse with modulation of both class AD and BD type. The advantage of this is that at low signal levels the amplifier obtains the linear properties of the class AD amplifiers at zero crossing and the low noise of the class BD amplifier. The pulse-with modulation type is here called class ABD.

17 Claims, 2 Drawing Sheets

METHOD OF ATTENUATING ZERO CROSSING DISTORTION AND NOISE IN AN AMPLIFIER, AN AMPLIFIER AND USES OF THE METHOD AND THE AMPLIFIER

FIELD OF THE INVENTION

The invention relates to a method of attenuating noise and zero crossing distortion in an amplifier consisting of two pulse width modulators in which an analogue or digital signal is pulse-width modulated to provide pulse-width modulated small-signals, wherein the outputs of the pulse width modulators represent a non-inverted analogue or digital input signal and an inverted analogue or digital input signal, respectively, controlling two sets of switches which, by means of a voltage supply, feed a load with two pulse-width modulated great-signals, which are proportional to the pulse-width modulated small-signals so as to generate a pulse-width modulated great-signal of the class BD type.

BACKGROUND OF THE INVENTION

The invention moreover relates to an amplifier having means for attenuating noise and zero crossing distortion and of the type comprising two pulse-width modulators adapted to pulse-width modulate an inverted and non-inverted analogue or digital signal to provide two pulse-width modulated small-signals, said pulse-width modulated small-signals being fed to two sets of switches adapted to connect and disconnect a voltage supply to provide a pulse-width modulated great-signal for a load.

The invention finally relates to uses of the amplifier.

Traditional amplifiers for audio use are used for amplifying audio signals and forming sound images in the loudspeaker. These amplifiers, however, do not have very high power efficiencies. Therefore, amplifiers are being constructed according to other principles.

These high efficiency amplifiers include e.g. those based on pulse width modulation, which are also called class D amplifiers.

Such an amplifier consists of a pulse width modulator, one or more sets of switches and a low-pass filter.

The principle of a class D amplifier is that one or more sets of switches are switched to conduct and non-conduct, respectively, depending on the amplitude of a signal, such as an audio signal. The information of the audio signal is hereby converted into a number of pulses which carefully correspond to the information of the audio signal.

Pulse-width modulated amplifiers are theoretically very linear and thus have a very low distortion, but practical realisations have shown non-linearities which have caused them to be unsuitable for use in High Fidelity amplifiers, if a strong negative feedback is not established.

However, establishment of feedback systems in pulse-modulated amplifiers is not an easy task, since negative feedback performed prior to the low-pass filtering adds much noise to the system.

Additionally, the load impedance, which is a loudspeaker, is incorporated in the feedback signal, and as it may vary depending on loudspeaker selection, the design of feedback systems is made difficult.

Pulse with modulation can be divided into several modulation classes. The most used are class AD and class BD modulation. Class AD is a modulation form where only two discrete levels are used, e.g., 1 and −1. In a class AD modulated amplifier, either plus the power supply voltage or minus the power supply voltage is applied to the load.

Class BD modulation can be viewed as a differential coupling of two class AD modulators, i.e., both a non-inverted as well as an inverted version of the signal input is pulse width modulated. The load is then connected differentially to the outputs of two output stages controlled of the two class AD modulators.

Class BD operation gives in many respects a number of benefits, i.e. many noise contributions are cancelled by the differential operation and the even-ordered non-linearities are generally cancelled.

However, it has been seen in prior art that class BD amplifiers suffer from cross-over distortion and higher noise around the zero-transition of the input signal.

A great part of the artefacts in pulse-with modulated amplifiers of the class BD type occurs because of interference between the pulse with modulators and the half-bridges in the output module, which results in cross-over distortion (zero crossing distortion) of and noise on the audio signal. The zero crossing distortion and noise occur because the waveforms and especially the puls-edges of the two differentially pulse-with modulated signals are interacting, especially when the edges are nearly coinciding in time during the zero transitions of the audio signal.

It is concretely seen in that the first-occuring edge of two closely spaced flanks interferes with the generation of the second edge so that this is slightly delayed or advanced temporally. It should be noted that the phenomenon occurs primarily when both modulators and half-bridges are switched within a time period which is smaller than a time constant determined by the circuit.

As mentioned, the known methods of linearising pulse-width modulated amplifiers require the use of strong negative feedback. These methods are particularly unsuitable for consumer amplifiers where design criteria such as low complexity and general applicability in a wide range of load are important.

SUMMARY OF THE INVENTION

Accordingly, an object of the invention is to provide a method which is capable of linearising class D type amplifiers by taking the interference between the half bridges and their respective control circuits into account, and by further minimising such interference. Thereby making it possible to produce pulse-width modulated amplifiers of low complexity.

The object of the invention is achieved by the method in which when the analogue or digital signal is close to the value 0, the switching times of the pulses fed to the switches will be shifted relative in time. This can be done by applying a constant delay to the switching times of the control signals so they will coincide at a resulting audio signal value slightly different from zero.

When, the separation is performed by delaying either the pulses representing the non-inverted part of the analogue or digital signal relative to the inverted part of the analogue or digital signal, or the method is performed by delaying the pulses representing the inverted part of the analogue or digital signal relative to the non-inverted part of the analogue or digital signal, the circuit-technical advantage is achieved that the non-linear range of the amplifier is shifted from the zero crossing of the audio signal to a higher signal level. The non-linear range of the amplifier is thus of influence only when the resulting audio signal exceeds the signal level where the non-linear range is present. The advantage of this is that the non-linearity of the amplifier, seen in relation to the level of the resulting audio signal, may be reduced to a level of minimum significance. Also achieved is the advantage that a significantly lower noise level for the amplifier in idle operation is achieved and at low volumes than by a pure class AD or BD operation. The modulation form is hereafter named class ABD, since the modulation shares features of both class AD and class BD modulation.

When, the separation is performed by either temporally delaying the carrier wave signal in the pulse width modulator modulating the non-inverted signal relative to the carrier wave signal in the pulse width modulator modulating the inverted signal, or by temporally delaying the carrier wave signal in the pulse width modulator modulating the inverted signal relative to the carrier wave signal in the pulse width modulator modulating the non-inverted signal, the circuit-technical advantage is achieved that the non-linear range of the amplifier is shifted away from the zero crossing of the audio signal to a higher signal level. The non-linear range of the amplifier is thus of influence only when the resulting audio signal exceeds the signal level where the non-linear range is present. The advantage of this is that the non-linearity of the amplifier, seen in relation to the level of the resulting audio signal, may be reduced to a level of minimum significance. Another achieved advantage is that the relatively simple circuit modification results in a significantly lower noise level for the amplifier in idle operation and at low modulations than by a pure class AD or BD operation.

When, the circuits transferring pulses representing the inverted and non-inverted part of the analogue or digital signal, are moreover separated in space so that the cross talk between the signals is minimized, the delay between the pulses may be reduced as much as possible.

Additionally, when, the attenuation is performed by providing a separation between the voltage supplies to the pulse width modulators and the switches representing the non-inverted and inverted part of the analogue or digital input signal, the mutual influence between the pulses at the switching times is additionally diminished.

Advantageously; the attenuation is performed by providing an electrical shield between the pulse width modulators and the switches representing the non-inverted and the inverted part of the analogue or digital input signal.

The noise and zero crossing distortion may also be attenuated in that the attenuation is performed by reclocking the pulse-width modulated small-signals immediately before these are applied to the sets of switches representing the non-inverted and the inverted part of the analogue or digital input signal, thereby ensuring that temporal errors which are induced because of lacking electrical separation/shielding are minimized to the greatest extent possible.

If the pulse-width modulated small-signals are balanced differential signals, noise and zero crossing distortion may also be attenuated. The differential inputs reduces the sensitivity to errors generated by common mode voltages on the control signals, and thereby temporary errors relating from voltage shifts in other parts of the amplifier can be reduced.

As mentioned, the invention also relates to an amplifier. This amplifier may have the means for attenuating zero crossing distortion and noise either formed by a delay circuit which delays the pulses representing the non-inverted part of the analogue or digital signal relative to the inverted art of the analogue or digital signal, or in that the means are formed by a delay circuit, which delays the pulses representing the inverted part of the analogue or digital signal relative to the pulses representing the non-inverted part of the analogue or digital signal.

An amplifier is produced hereby, in which zero crossing distortion and noise may be minimized without complicated feedback stages.

Expedient embodiments of the amplifier are defined in claims 10 and 11, as explained in connection with the method claims.

In this connection it is noted that as stated in claim 12, that the amplifier has multiple audio channels and that the signals to the half-bridges in the channels are independently delayed, it is achieved that not only the non-linear ranges of the amplifier channels are shifted from the zero crossing of the audio signal to a higher level, but also the cross talk between the audio channels are shifted to higher audio levels. The advantage of this is that the idle noise of each amplifier channels can be minimised to the level as of a single ampflier channel and that the cross talk between the channels can be transformed to higher audio signal levels.

The uses according to these claims allow a much simpler structure than the traditionally used feedback in pulse-width modulated amplifiers of an analogue as well as a digital type.

The invention will now be explained more fully below with reference to an embodiment shown in the drawing, in which

DETAILED DESCRIPTION

Figure 1:
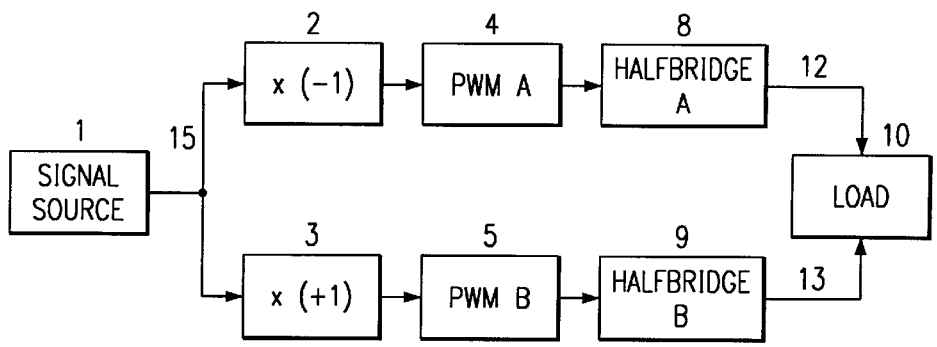
FIG. 1 shows a block diagram of a class BD amplifier according to prior art.

In FIG. 1, the numeral 1 designates an audio signal generator with audio signal 15, and the numerals 2 and 3 designate an inverting block and non-inverting block, respectively. The inverted and non-inverted signals are pulse-width modulated in a known manner in the digital or analogue pulse width modulators 4 and 5.

The signals generated in the pulse width modulators whose output signals are used for controlling the half-bridges (sets of switches) 8 and 9. The system of FIG. 1 operates in class BD operation. The pulse-width modulated power-signal, which e.g. describes an audio signal represented by high-frequency pulses, is demodulated and fed to a load, here shown as numerical 10.

Figure 2:
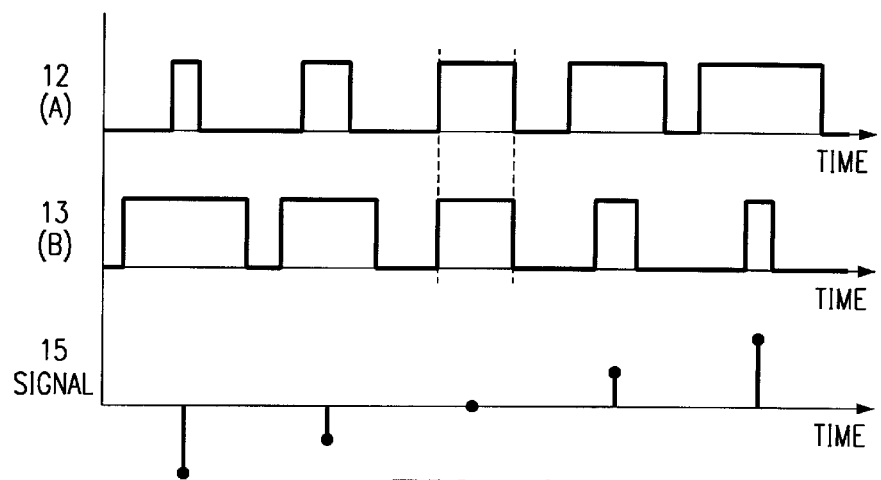
FIG. 2 shows the principle of how a class BD pulse-width modulated signal is generated when an audio signal is fed to the amplifier in FIG. 1.

FIG. 2 schematically shows how the pulse width modulation in the pulse width modulators 4 and 5 takes place as a function of a signal with non-inverted and inverted signal parts, respectively. Note that the pulse edges of the two outputs 12 and 13 are coinciding for zero signal amplitude 15.

Figure 3:
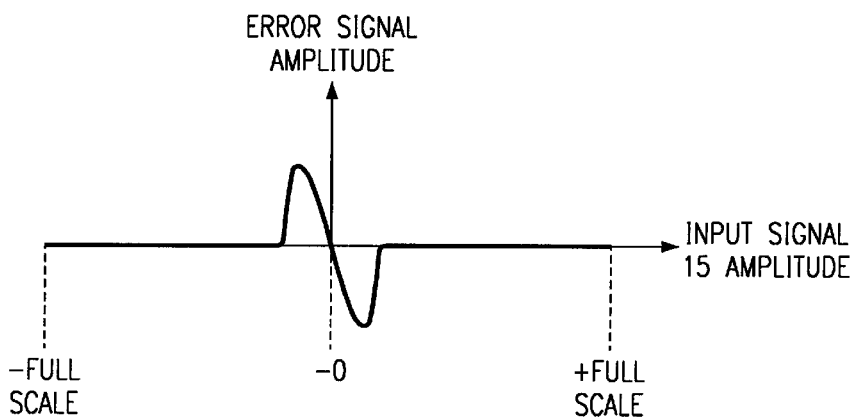
FIG. 3 shows an example of the error signal as a function of the input signal amplitude.
Figure 4:
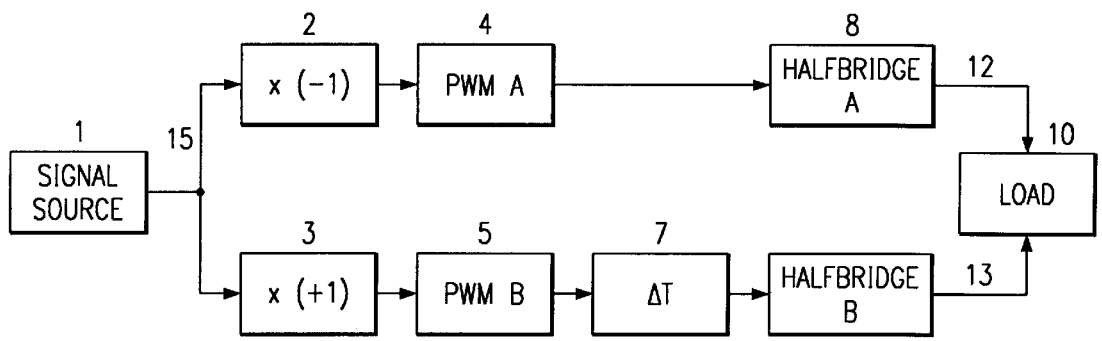
FIG. 4 shows a block diagram of a class BD ampflier according to the invention using a delay of ΔT inserted for the non-inverting leg (B)

FIG. 3 shows the error/noise signal due to interference of the pulse edges. Note the concentrated error around the zero-transition of the input signal amplitude due to the coinciding pulse edges.

The error signal expresses the deviation from linearity and has high amplitude during the zero-transition of the audio signal. The explanation is that immediately following a pulse edge, there is a great deal of disturbance in the amplifier circuitry due to the large scale voltage and current transients involving in switching a class D output stage. The disturbance affects both the timing and waveform of signals in the opposite modulator and half-bridge—especially when the opposite modulator and half-bridge switches shortly after. For instance, one pulse edge transition can cause a slight modulation of the propagation delays in the signal paths of opposite polarity (the other modulator half/bridge). The delay modulation causes a non-linear error signal to be introduced in the resulting signal on the load. This modulation varies strongly with the timing between the edges of the two sets of modulators/half-bridges.

The described effect accounts for the observed error signal where the error-energy is localised around the zero-transition of the input signal, where the pulse edges of the two modulator/half-bridge sections are nearly coinciding in time. Such error signal causes a great amount of cross-over distortion, since the error-level is very high compared to a low amplitude audio input. Such cross-over distortion is very undesirable in a high quality audio system.

Furthermore, the nature of the error signal also increases the noise at the amplifier output. This is especially true for a digitally modulated amplifier using noise-shaping, where the strong and localised non-linearity around the zero-transition causes the otherwise spectrally shaped noise to be modulated into the audible range.

Conversely, for a pure class AD modulated amplifier, the error signal has highest amplitude at full-scale audio signal levels and results in a distortion measure that is increasing with the signal level, i.e. the class AD modulation causes no cross-over distortion. Such distortion characteristic is perceived as more pleasant to listen to.

However, a class AD modulated amplifier has typically a poorer signal to noise ratio than compared to a class BD modulated amplifier. The reason for that is that the differential coupling inherent to class BD operation cancels many common-mode noise-sources and theoretically all non-linearities of even order.

Figure 5:
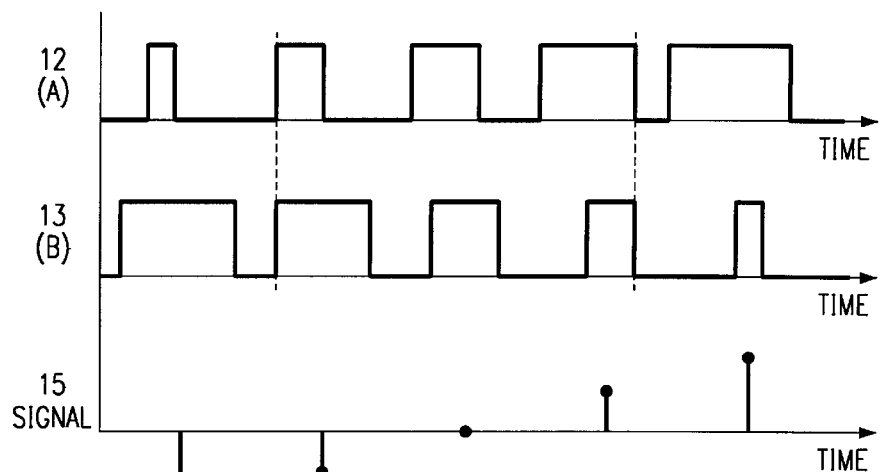
FIG. 5 shows the effect of the delay introduced in the block diagram of FIG. 4

It is schematically shown in FIG. 1A how the simultaneous switching of a pure class BD modulated amplifier at zero signal input may be avoided by introducing a delay $\Delta T$ (numerical 7) between the switching times in the sets of switches. The effect of this delay is also shown in FIG. 5 where the pulse edges are only coinciding at higher signal amplitudes. The effect of introducing such a delay is that it separates the pulse edges of the two sets of modulators/half-bridges for zero audio signal input.

Figure 6:
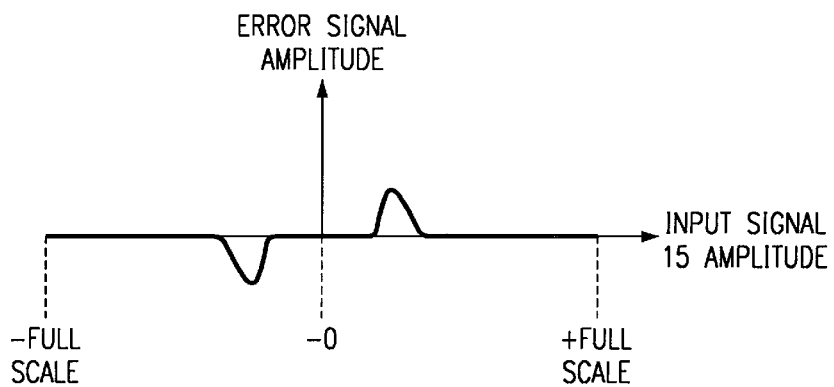
FIG. 6 shows an example of the error signal as a function of the amplitude in the amplifier in FIG. 4.

This means that the error signal is removed from the zero-crossing of the audio signal and concentrated at a higher audio signal amplitude level as shown in FIG. 6. This effectively reduces the distortion ratio, since the error energy is unchanged while the audio signal must have a certain minimum amplitude before distortion is generated, i.e. the ratio between signal and distortion components is higher.

The delay $\Delta T$ thus has the effect that a pulse-modulated great-signal is achieved, containing characteristics of both class AD type and class BD type, here called class ABD. Actually, class ABD modulation has the low noise characteristics similar to class BD modulation while being free of the cross-over distortion—similar to class AD modulation.

It should be noted in this connection that the delay $\Delta T$ has very little influence on the resulting low-pass filtered output signal.

Since both sets of modulator/half-bridges carry signal information, the effect of the delay is a linear filtering of the audio signal with the transfer function:

$$H(\omega) = \tfrac{1}{2} * (1 + e^{-j\omega \Delta T}) \quad \text{(EQ. 1)}$$

Since $\Delta T$ normally is very small (e.g. 50 ns) compared to the period of the highest audio frequency (e.g. 20 kHz corresponding to a period of 50 $\mu$s) the amplitude error according to EQ. 1 is very small (i.e. in the order of 0.03 dB for the example mentioned above in parantheses).

The advantage of class BD modulation is thus as described before due to a cancellation of common mode error sources.

When the $\Delta T$ delay is introduced, this cancellation is no longer perfect and the transfer function can be expressed by the following equation:

$$G(\omega) = \tfrac{1}{2} * (1 - e^{-j\omega \Delta T}) \quad \text{(EQ. 2)}$$

However, with the arguments stated above, it can be realized that the effective cancellation error is typically very low in the audible range (approx. −50 dB at 20 khz for $\Delta T$=50 ns as used in the example above).

To limit the temporal delay $\Delta T$ as much as possible, electrical shielding may moreover be provided between the two signal paths of the two sets of modulators/half-bridges.

Preferably, the two signal paths may be separated from each other. The better separation, the less interference between the modulators/half-bridges takes place, and the lower noise and distortion is obtained. The typical sources of interference are:

a) Disturbance through clock lines for digital modulators.
b) Disturbance through the carrier waveform for analog modulators.
c) Disturbance through the power supplies of the control logic and half-bridges.
d) Interference due to ground-bounce of IC packages.
e) Interference due to electromagnetic radiation.

The interference can be minimised by:
Re-clocking of small signals just before the half-bridges.
Filtering and separation of power supply lines for half-bridges and control signals.
Use of separate IC packages for the two sets of modulators/half-bridges.
Use of differential transmission for the control signals.

As will be appreciated from the foregoing, the invention provides an amplifier which is very universal with a very low complexity.

The amplifier may be designed such that it may be used for many types of loads, without this interfering with the specifications of the amplifier.

In addition, the amplifier may be produced with relatively small dimensions relative to traditional amplifiers because of the high efficiency and thereby undesired high heat emission.

What is claimed is:

1. A method of attenuating noise and zero crossing distortion in an amplifier comprising providing two pulse width modulators, in which an analogue or a digital signal is pulse-width modulated to provide pulse-width modulated small-signals, the outputs of the pulse width modulators representing a non-inverted analogue or digital input signal and an inverted analogue or digital input signal, respectively; controlling two sets of switches which, by means of a voltage supply, feed a load with two pulse-width modulated great-signals which are proportional to the pulse-width modulated small-signals, wherein when the analogue or digital signal is close to the value 0, the switching times of the pulses fed to the switches, will be separated; and wherein the separation is performed either by delaying the pulses representing the non-inverted part of the analogue or digital signal relative to the inverted part of the analogue or digital signal, or by delaying the pulses representing the inverted part of the analogue or digital signal relative to the non-inverted part of the analogue or digital signal.

2. A method according to claim 1, wherein the separation is performed either by temporally delaying the carrier wave signal in the pulse width modulator modulating the non-inverted signal relative to the carrier wave signal in the pulse width modulator modulating the inverted signal, or by temporally delaying the carrier wave signal in the pulse width modulator modulating the inverted signal relative to the carrier wave signal in the pulse width modulator modulating the non-inverted signal.

3. A method according to claim 1, wherein the circuits transferring the pulses representing the inverted and non-inverted part of the analogue or digital signal are separated such that the crosstalk between the signals is attenuated as much as possible.

4. A method according to claim 3, wherein the attenuation is performed by providing a separation between the voltage supplies to the pulse width modulators and the switches representing the non-inverted and inverted part of the analogue or digital input signal.

5. A method according to claim 3, wherein the attenuation is performed by providing electrical shielding between the pulse width modulators and the switches representing the non-inverted and inverted part of the analogue or digital input signal.

6. A method according to claim 3, wherein the attenuation is performed by reclocking the pulse-width modulated small-signals immediately before they are applied to the sets of switches representing the non-inverted and inverted part of the analogue or digital input signal.

7. A method according to claim 1 wherein the pulse-width modulated small-signals are balanced differential signals.

8. An amplifier having means for attenuating noise and zero crossing distortion comprising a pulse width modulator which pulse-width modulate an inverted and non-inverted analogue or digital signal to provide two pulse-width modulated small-signals, said pulse-width modulated small-signals being fed to two sets of switches which connect and disconnect a voltage supply to provide a pulse-width modulated great-signal for a load, wherein the means for attenuating zero crossing distortion and noise being formed by a delay circuit, which either delays the pulses representing the non-inverted part of the analogue or digital signal relative to the inverted part of the analogue or digital signal, or delays the pulses representing the inverted part of the analogue or digital signal relative to the pulses representing the non-inverted part of the analogue or digital signal.

9. An amplifier according to claim 7, wherein the signal paths transferring the pulses representing the non-inverted part and the inverted part, respectively, of the analogue or digital signal are separated from each other.

10. An amplifier according to claim 7, wherein the signal paths transferring the pulses representing the inverted part and the non-inverted part, respectively, of the analogue or digital signal are shielded electrically from each other.

11. An amplifier according to claim 8 wherein the amplifier has multiple audio channels and the signals to the half bridges in the channels are independently delayed.

12. The method of claim 1 wherein said amplifier utilizes feedback.

13. The method of claim 1 wherein said amplifier is an analog class D amplifier.

14. The method of claim 1 wherein said amplifier is a digital class D amplifier.

15. The amplifier of claim 8 wherein said amplifier utilizes feedback.

16. The amplifier of claim 8 wherein said amplifier is an analog class D amplifier.

17. The amplifier of claim 8 wherein said amplifier is a digital class D amplifier.

* * * * *